United States Patent [19]

Okamoto

[11] Patent Number: 5,726,938

[45] Date of Patent: Mar. 10, 1998

[54] SEMICONDUCTOR DEVICE PROVIDED WITH A LEVEL CONVERSION MEANS FOR ENABLING A CONNECTION BETWEEN LOGIC CIRCUITS

[75] Inventor: Toshiharu Okamoto, Tokyo, Japan

[73] Assignee: NEC Corporation, Japan

[21] Appl. No.: 662,710

[22] Filed: Jun. 13, 1996

[30] Foreign Application Priority Data

Jun. 22, 1995 [JP] Japan .................... 7-155822

[51] Int. Cl.⁶ .................... G11C 7/00; G11C 8/00
[52] U.S. Cl. .................... 365/189.11; 365/189.11; 365/203; 365/230.06; 326/106
[58] Field of Search .................... 365/189.11, 203, 365/230.06, 185.18; 326/106, 108

[56] References Cited

U.S. PATENT DOCUMENTS 5,490,119  2/1996  Sakurai et al. .................... 365/230.06
5,557,580  9/1996  Numaga et al. .................... 365/230.06

OTHER PUBLICATIONS

"A High–Speed Ultra–Low Power 64k CMOS EPROM with On–Chip Test Functions" KNECT et al IEEE Journal of Solied–State Circuites, vol. Sci–18, No. 5 Oct. 1983, pp. 554–561.

Primary Examiner—David C. Nelms
Assistant Examiner—Huan Hoang
Attorney, Agent, or Firm—Hayes, Soloway, Hennessey, Grossman & Hage, P.C.

[57] ABSTRACT

A semiconductor device provided with a level inversion means comprising a transfer gate N4 for transmitting the output of an NAND circuit 1 to an inverter circuit 2, and a PMOS transistor P4 for pulling up the input terminal of the inverter circuit 2 up to VPP potential in response to the output data of the NAND circuit 1 when the input terminal of the inverter circuit 2 connected to the output terminal of the transfer gate is to be pulled up to the supply potential of VPP.

18 Claims, 7 Drawing Sheets

SEMICONDUCTOR DEVICE PROVIDED WITH A LEVEL CONVERSION MEANS FOR ENABLING A CONNECTION BETWEEN LOGIC CIRCUITS

BACKGROUND OF THE INVENTION

1. Field of the Invention

This invention relates to a semiconductor device, and in particular to a semiconductor device provided with a level conversion means for enabling a connection between logic circuits, each circuit being supplied with a supply voltage of different level from that supplied to the other circuit.

2. Description of Related Art

There is known, as a semiconductor device provided with a level conversion means, a non-volatile semiconductor memory device which is capable of electrically writing and reading data. In order to perform the writing and erasing of data, it is generally required for this non-volatile semiconductor memory device to employ a voltage of 5V as an ordinary supply voltage VCC, and additionally a voltage of 12V for example as a high supply voltage VPP which is higher than 5V.

In this case, there are mounted a logic circuit group which can be actuated by the supply of VCC and another logic circuit group which can be actuated by the supply of VPP on a single semiconductor substrate. The transmission of signals between these circuit groups differing in supply voltage from each other is achieved through a transfer transistor (hereinafter referred to as a transfer gate), thus electrically separating the logic circuit groups from each other so as to prevent the VCC-actuating circuit group from being supplied with the voltage of VPP.

Moreover, for the purpose of raising the VCC level, i.e. the high level of the logic level of input signal to be supplied to the VPP-actuating circuit group, up to the VPP level, i.e. the high level of the logic level of output signal, a level conversion means is generally mounted.

FIG. 1 shows a main portion of one embodiment where this level conversion means is applied to the decoder circuit of a non-volatile semiconductor memory device.

Referring to FIG. 1, there is shown an NAND circuit 1 comprising input terminals IN1 to IN3, p-channel MOS transistors (hereinafter referred to as PMOS transistors) P1 to P3, and n-channel MOS transistors (hereinafter referred to as NMOS transistors) N1 to N3, the NAND circuit 1 being supplied with VCC as a driving power source. There is also shown an inverter circuit 2 having an output terminal OUT, to which VPP is supplied as a driving power source. Between the output terminal of the NAND circuit 1 and the input terminal of the inverter circuit 2, a transfer gate N4 is connected in series, to which VCC is supplied via the gate electrode thereof.

A PMOS transistor P4 is connected between the output terminal of the transfer gate N4 and the power terminal Vpp. The gate electrode of the PMOS transistor P4 is connected with the output terminal of an inverter circuit 3 comprising a PMOS transistor P5 and an NMOS transistor N5, the inverter circuit 3 being adapted to be supplied with VPP as a driving power source. The input terminal of the inverter circuit 3 is connected with the output terminal of the transfer gate N4.

Namely, this level conversion means is constructed to include a level conversion circuit comprising the transfer gate N4, the PMOS transistor P4 and the inverter circuit 3.

The operation of this circuit will be explained first taking the case where the NAND circuit 1 of the first step logic circuit outputs a high level. When at least one of the signals which have been fed to the input terminals IN1 to IN3 of the NAND circuit 1 becomes a low level, data of high level is caused to be fed from the NAND circuit 1 to the transfer gate N4. Since the transfer gate N4 is supplied via the gate electrode thereof with VCC, the transfer gate N4 is always kept in a conductive state during the operation thereof so that the data of high level reaching a node A is transmitted to a node B. The high level at the node B is the one which has been decreased by the threshold voltage of the transfer gate N4 (VCC-VTN4).

The high level of this node B is inverted at the inverter circuit 3 to become a low level, thus allowing the PMOS transistor P4 to become conductive. Therefore, the high level of the node B (VCC-VTN4) can be pulled up to the VPP level of the terminal Vpp. Accordingly, the potential of low level will be output from the output terminal OUT of the inverter circuit 2.

Now, the case where the NAND circuit 1 outputs a potential of high level will be explained. When all of the signals which have been fed to the input terminals IN1 to IN3 of the NAND circuit 1 becomes the high level, a low level is fed from the NAND circuit 1 via the node A to the transfer gate N4.

Since the transfer gate N4 is kept in the conductive state also in this occasion, a potential of low level of the node A is transmitted to the node B. This potential of low level is inverted at the inverter circuit 3 to become a high level and to turn the PMOS transistor P4 into a non-conductive state. Therefore, the potential of the node B is maintained in a state of low level, and hence the inverter circuit 2 is caused to output a potential of high level to the output terminal OUT.

Namely, the output of the NAND circuit 1 constituting the first step circuit of the VCC line has its level converted by the level conversion circuit before being transmitted to the inverter 2 of the second step circuit of the VPP line.

Another example of the level conversion means of similar kind is described in IEEE JOURNAL OF SOLID-STATE CIRCUITS, vol. SC-18, No. 5, October 1993, pp.556. FIG. 2 shows the circuit diagram of the main portion of the decoder circuit of the level conversion means described in this publication. Referring to FIG. 2, the VCC is supplied as a supply voltage to an NAND circuit 4 comprising a PMOS transistor P1 whose gate electrode is connected to a row clock terminal and transistors N1 to N3 whose gate electrodes are connected to the predecoders 1 to 3 respectively.

The output terminal of this NAND circuit 1 is connected via a node A, a transfer gate N4 and a node B to the input terminal of the inverter circuit 2 to which VPP is supplied as a supply voltage.

A PMOS transistor P4 is connected between the node B and the terminal Vpp, and the gate electrode of the PMOS transistor P4 is connected to the output terminal of the inverter circuit 2. A level conversion circuit is constituted by the transfer gate N4 and the PMOS transistor P4.

The operation of this circuit will be explained below. When the NAND circuit 1 is actuated to output the high level, at least one of the signals to be fed to the terminals of the predecoders 1 to 3 becomes the low level, and if the signal to be fed to the terminal of the row clock becomes the low level, the high level of vCC that has been obtained by the conduction of the PMOS transistor P1 is transmitted via the node A to the transfer gate N4 from the NAND circuit 1.

Since the transfer gate N4 is kept in a conductive state as it is supplied via the gate electrode thereof with VCC, the high level of the node A is transmitted via the node B to the inverter circuit 2. The degree of high level at the node B can be expressed by (VCC-VTN4).

The inverter circuit 2 outputs the low level and at the same time this low level is supplied to the gate electrode of the PMOS transistor P4. Therefore, the PMOS transistor P4 becomes conductive and pulls up the potential of the node B (VCC-VTN4) to the VPP level.

On the other hand, when the NAND circuit 1 is actuated to output the low level, all of the signals to be fed to the terminals of the predecoders 1 to 3 become the high level, and if the signal to be fed to the terminal of the row clock becomes the high level, the PMOS transistor P1 in the NAND circuit 1 is turned into a non-conductive state so that all of the NMOS transistors N1 to N3 are turned conductive, thus causing the output terminals thereof to become the ground potential. Accordingly, the low level is transmitted via the node A to the transfer gate N4. Then, this low level is transmitted via the transfer gate N4 and the node B to the inverter circuit 2 to turn the output into the high level. Due to this high level, the PMOS transistor P4 is turned into a non-conductive state and the node B is maintained at the low level.

Namely, in this example also, the output of the NAND circuit 1 constituting the first step circuit of the VCC line is level-converted by the level conversion circuit before being transmitted to the inverter 2 of the second step circuit of the VPP line.

However, there is a problem in the conventional semiconductor device shown in FIG. 1 that when the high level of VCC potential at the node B is pulled up to the high level of VPP potential, the transmitting time required for transmitting the potential from the node A to the node B becomes prolonged due to a large conduction resistance of the transfer gate N4. For example, the relationship between the transmission time at the nodes A and B and the supply potential is shown as a waveform diagram in FIG. 3. In FIG. 3, the axis of ordinate indicates a supply voltage, and the axis of abscissa indicates the transmission time. The time required for the potential of the node B to shift from the low level to the high level at the time interval between the time t1 and the time t5 becomes longer than the time required for the potential of the node A to shift from the low level to the high level at the time interval between the time t1 and the time t2 (t5>t2). The output of the inverter circuit 2 to be supplied to the gate electrode of the PMOS transistor P4 also takes a long period of time in shifting from the high level to the low level, thus causing the PMOS transistor P4 to take a longer period of time in taking a conductive state.

Therefore, there are problems that the time to pull up the potential of the node B from VCC-VTN4 level to VPP level by the PMOS transistor P4 will be also delayed, and the time required for the potential of the output terminal OUT of the inverter circuit 2 to take the low level will also be delayed.

In the case of pulling down the potential of the node B also, since the conduction resistance of the transfer gate N4 is relatively large, it is not until the time t11 that the node B becomes the low level after both of the nodes A and B start to shift from the high level to the low level at the time t6, whereas the node A becomes the low level at the time t8. This means that the transmission time for transmitting the potential from the node A to the node B will be prolonged (t11>t8).

Namely, when the potential of the node A is shifted from the high level to the low level, the potential of the node B also takes a longer period of time in shifting from the high level via the transfer gate N4 to the low level, and the output of the inverter circuit 2 takes a longer period of time in shifting from the low level to the high level.

Therefore, the time required for the PMOS transistor P4 in changing from the conductive state into the non-conductive state is prolonged, thus delaying the time required for the potential of the output terminal OUT of the inverter circuit 2 to become the high level.

Meanwhile, in the case of the conventional example shown in FIG. 2, there are also problems that when the potential of the node B is to be pulled up, the transition time required for the potential of the node B in shifting from the low level to the high level will be delayed due to a large conduction resistance of the transfer gate N4. Therefore, the terminal OUT of the inverter circuit 2 also takes a long period of time in shifting from the high level to the low level.

Therefore, the time required for the PMOS transistor P4 supplied with the potential of the output terminal OUT thus delayed in changing from the non-conductive state into the conductive state will be delayed, and the time required for pulling up the node B from the VCC-VTN4 level to the VPP level will also be delayed.

On the other hand, when the potential of the node B is to be pulled down from the high level to the low level , the transition time required for the potential of the node B from the high level to the low level will be prolonged, and the time required for the terminal OUT of the inverter circuit 2 in changing from the low level to the high level will be delayed. Therefore, the time required for the PMOS transistor P4 supplied with this delayed potential of this output terminal OUT in changing from the conductive state into the non-conductive state will be delayed, and the time required for pulling down the node B from the VPP level to the low level will also be delayed.

In an attempt to minimize the conduction resistance of transfer gate N4 which has been a cause of the delay in shifting time of the output terminal OUT of the aforementioned conventional inverter circuit 2 in changing from the low level to the high level, or from the high level to the low level, it has been generally adopted to enlarge the transistor size of the transfer gate. However, the enlargement of the transistor size of the transfer gate is accompanied with a drawback that the area for the circuit on a semiconductor chip will be increased.

There is also a problem that when the inverter circuit 2 is to be shifted from the low level to the high level, the node B may be still in a transient state shifting from the high level to the low level when the node A has already been shifted from the high level to the low level due to the time lag in the transition time between the node A and the node B. During this transient duration, a through electric current I4 or I5 flows from the terminal Vpp through the PMOS transistor P4→the node B→the transfer gate N4→the node A→the NMOS transistors N1–N3 of the NAND circuit 1 to the ground potential, thereby increasing the power consumption.

SUMMARY OF THE INVENTION

This invention has been made in view of the aforementioned problems and therefore, an object of the present invention is to provide a semiconductor device which is capable of shortening the delay in speed of transmission due to the difference in transmitting time between both ends of a transfer gate that has been interposed between the circuits in the occasion of converting the potential level between circuits, each circuit being supplied with a supply voltage of different level from that supplied to the other circuit.

Namely, according to the present invention, there is provided a semiconductor memory device comprising;

the first stage logic circuit to be supplied with the first supply potential for processing a plurality of data;

the second stage logic circuit to be supplied with the second supply potential for processing an output data derived from said first stage logic circuit and for transferring resultant processed data to a subsequent stage;

a transfer gate interposed between said first stage logic circuit and said second stage logic circuit, and adapted to be turned into a conductive state when said first supply potential is supplied to a gate electrode thereof for transmitting a low level of potential to said second stage logic circuit when an output data from said first stage logic circuit is a low level of a logic level, and transmitting the second high level of potential which is lower than the first high level of said logic level by a magnitude of threshold voltage enabling said first supply potential to flow through said gate electrode to said second stage logic circuit when the output data from said first stage logic circuit is the first high level of said logic level; and a level conversion means being performed by pulling up an input terminal of said second stage logic circuit from said second high level to said second supply potential in response to said second high level;

and wherein that the output data of the first stage logic circuit is employed in place of said second high level, and a level conversion means is provided for pulling up said input terminal of said second stage logic circuit from said second high level to said second supply potential in response to said first high level of said output data.

The level conversion means may include a current-cutoff means for cutting off a through electric current flowing from the second supply potential via the transfer gate to the ground potential of the first stage logic circuit for a predetermined period of time in response to a control signal of the third high level.

The level conversion means may be constructed such that the transfer gate is interposed between the output terminal of said first stage logic circuit and the input terminal of said second stage logic circuit so as to be connected therebetween in series; the first p-channel MOS transistor is interposed between the input terminal of said second stage logic circuit and said second supply potential; and said output terminal of said first stage logic circuit is connected via an inverter circuit to the gate electrode of said MOS transistor.

The current-cutoff means may be constructed such that the second p-channel MOS transistor adapted to be supplied through the gate electrode thereof with a control signal of said third high level is interposed between said second supply potential and said first p-channel MOS transistor in series, and at the same time the potential at the series connection point of the first and second p-channel MOS transistors is supplied as a supply potential of said second stage logic circuit.

The current-cutoff means may be constructed such that said second p-channel MOS transistor adapted to be supplied through the gate electrode thereof with a control signal of said third high level is interposed between said first p-channel MOS transistor adapted to be supplied with said second supply potential and the input terminal of said second stage logic circuit thereby forming a series connection.

The control signal of the third high level may be transmitted during a transient period after the output terminal of said first stage logic circuit is shifted from the high level to the low level and before the shifting of said first p-channel MOS transistor adapted to be supplied with said second supply potential from a conductive state to a non-conductive state is finished, and the voltage of said control signal of the third high level should be at most the level of said second supply potential or higher than the level which is lower than said second supply potential by a magnitude of threshold voltage of said second p-channel MOS transistor.

Furthermore, said first supply potential may be supplied in place of said second supply potential.

BRIEF OF DESCRIPTION OF THE DRAWINGS

Figure 5:
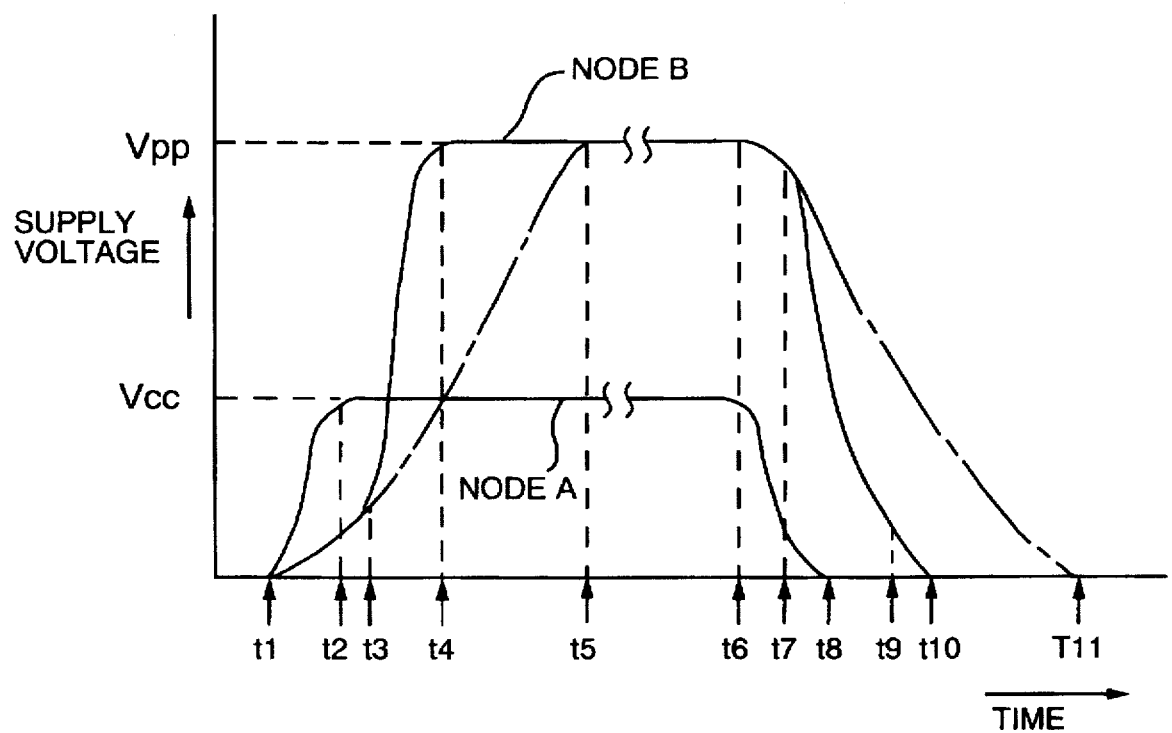
Figure 6:
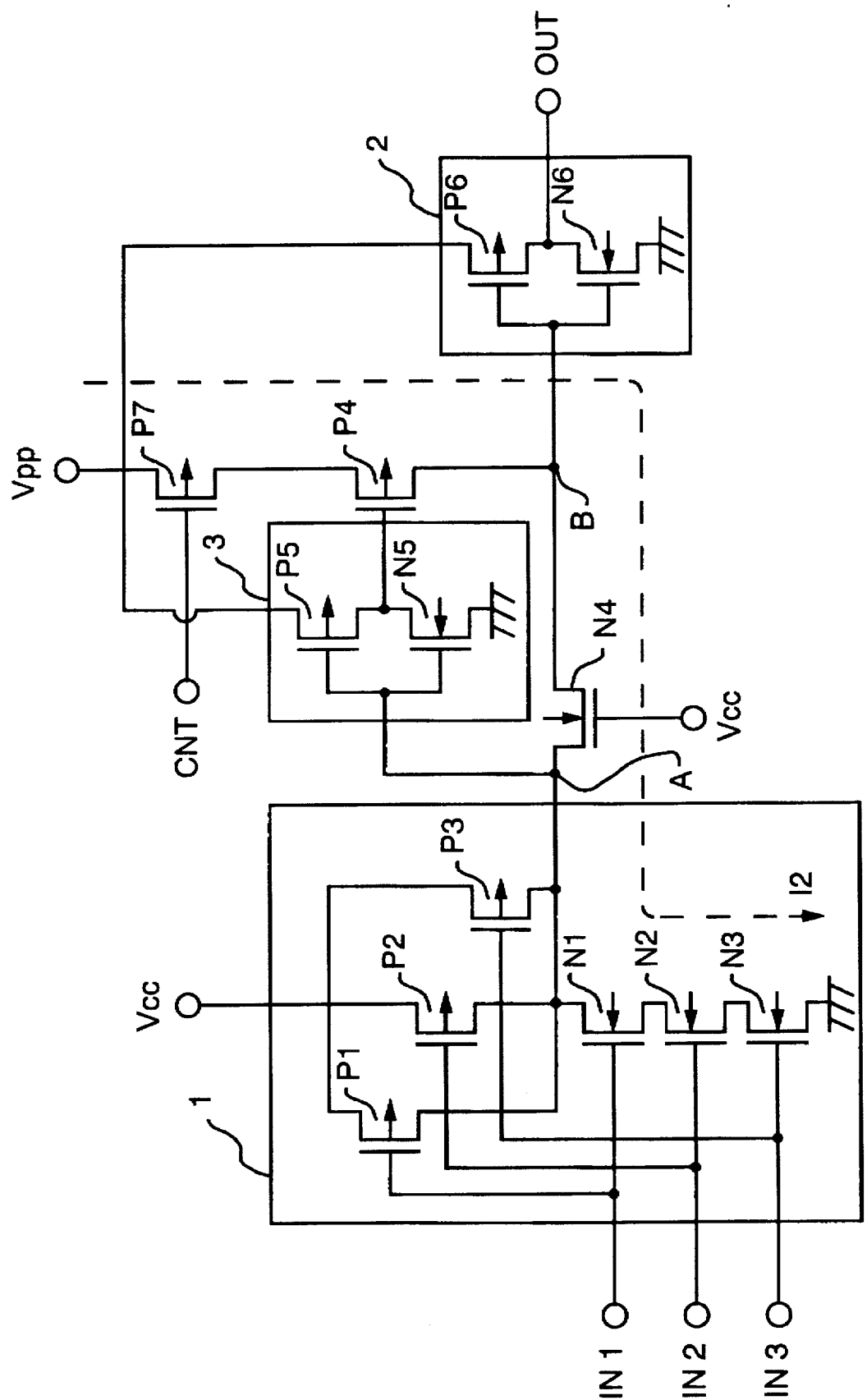
Figure 7:
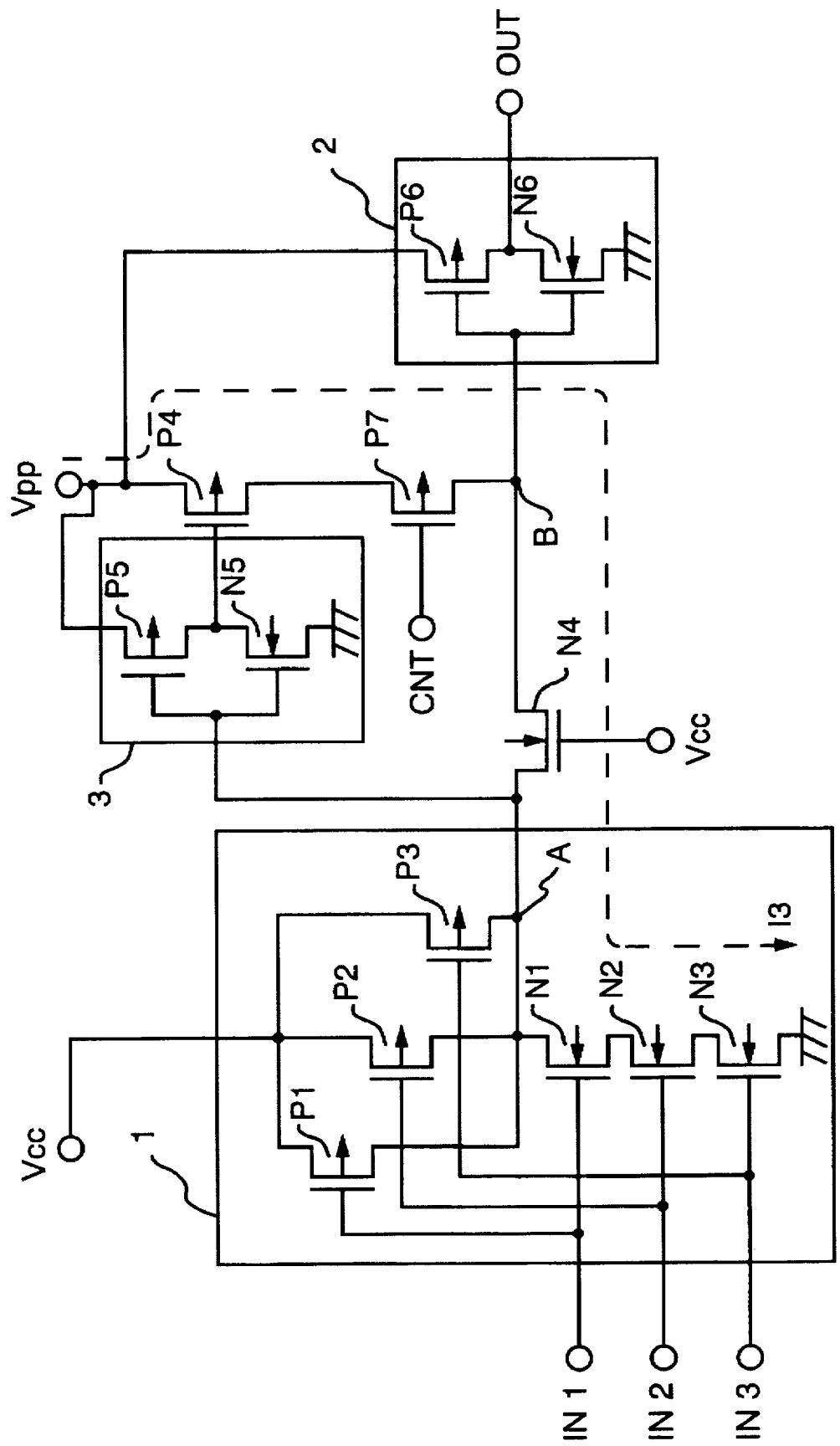

The FIG. 5 is a diagram showing as a waveform the transition of transmitting potential at the input terminal (node A) of a transfer gate and the output terminal (node B) of the transfer gate according to Example 1 of this invention;

FIG. 6 is a circuit diagram showing another example of a level conversion means according to Example 2 of this invention; and FIG. 7 is a circuit diagram showing still another example of a level conversion means according to Example 3 of this invention.

DETAILED DESCRIPTION OF THE PREFERRED EMBODIMENTS

This invention will be explained further with reference to drawings depicting examples of this invention.

EXAMPLE 1

Figure 1:
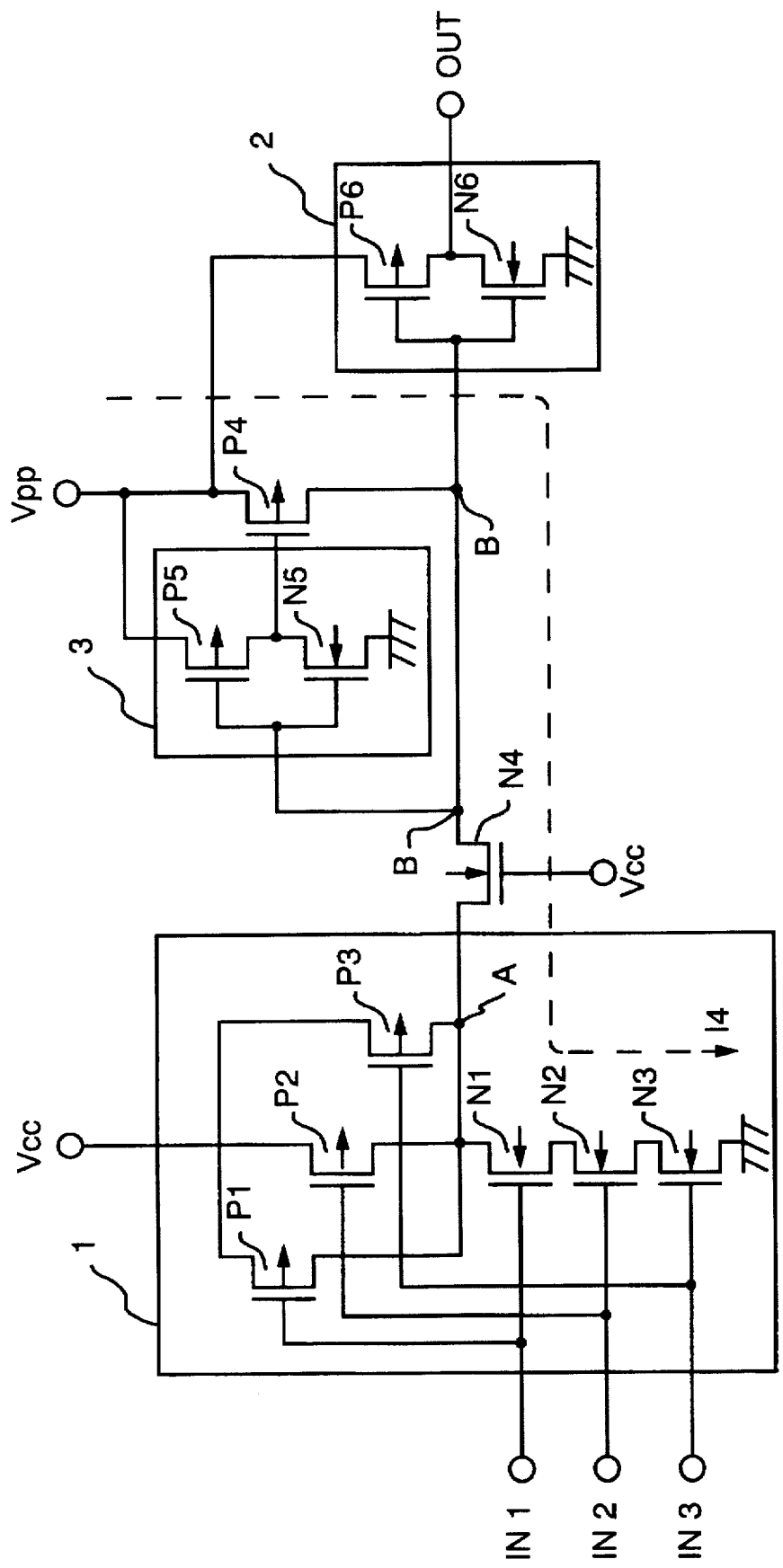
FIG. 1 is a circuit diagram showing a main portion of a decoder circuit as one example of a level conversion means as it is applied to a conventional semiconductor device.
Figure 2:
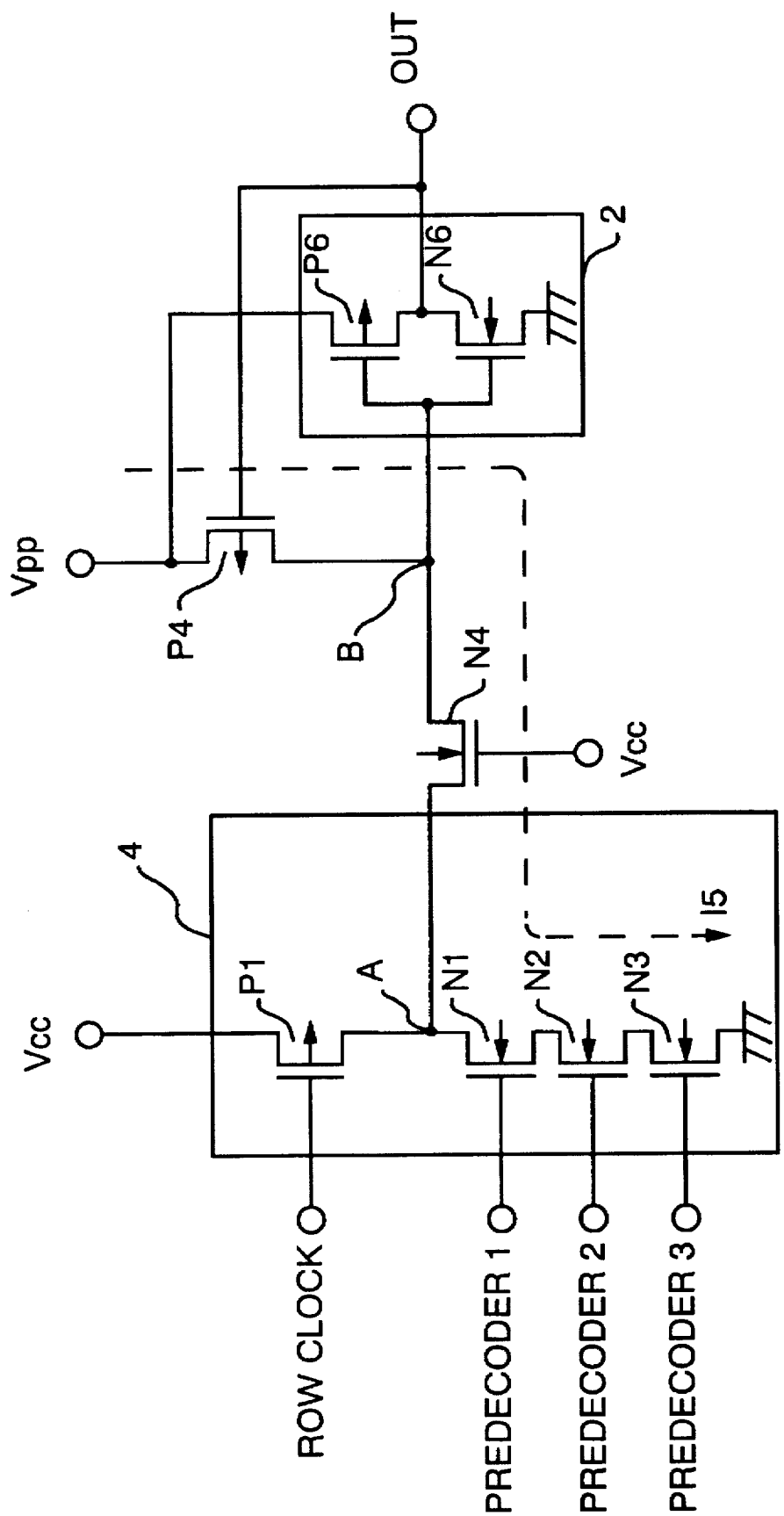
FIG. 2 is a circuit diagram showing a main portion of a decoder circuit as another example of a level conversion means as it is applied to a conventional semiconductor device.
Figure 3:
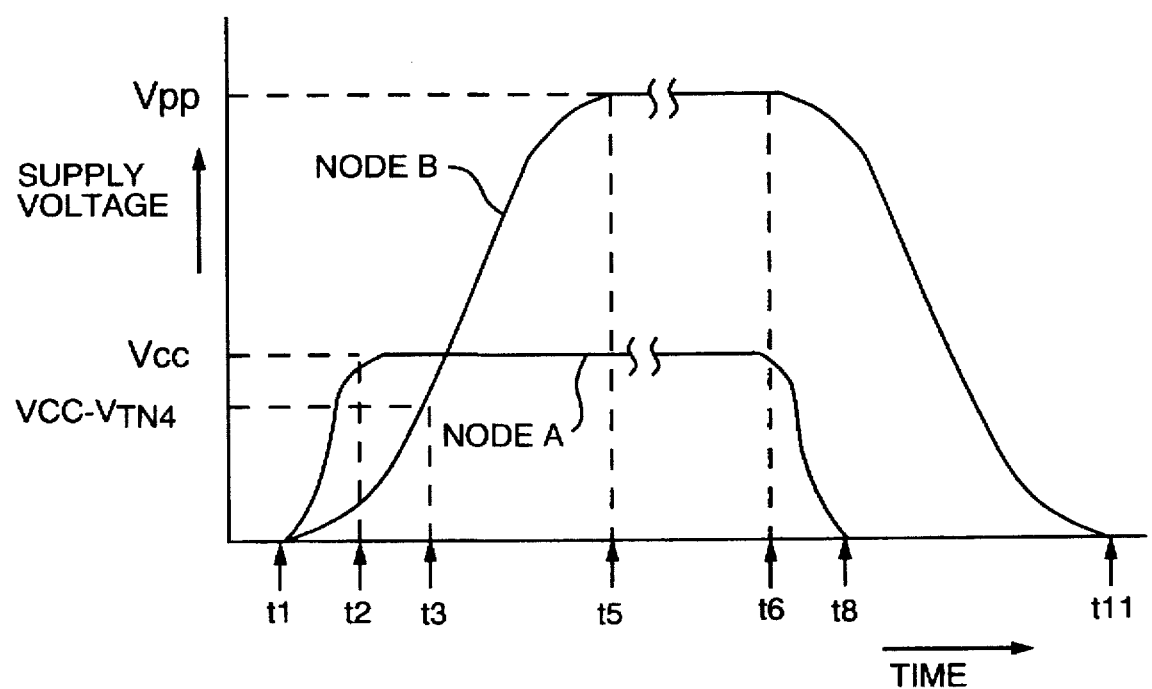
FIG. 3 is a diagram showing as a waveform the transition of transmitting potential at the input terminal (node A) of a conventional transfer gate and the output terminal (node B) of the conventional transfer gate.
Figure 4:
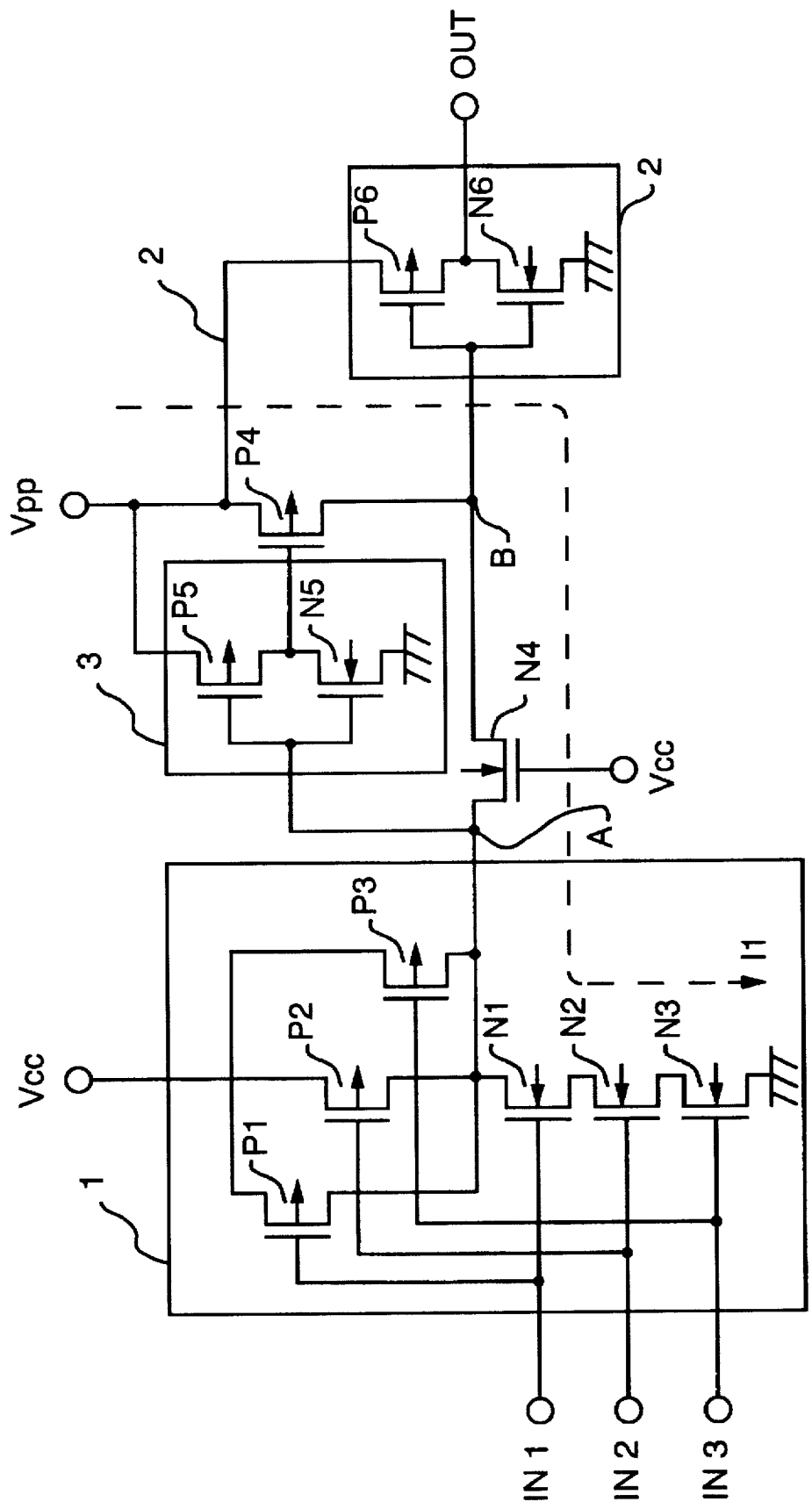
FIG. 4 is a circuit diagram showing one example of a level conversion means as it is applied to a semiconductor device according to Example 1 of this invention.

First of all, the first embodiment of this invention will be explained with reference to drawings. FIG. 4 illustrates a circuit diagram showing a first embodiment of a level conversion means as it is applied to a semiconductor device of this invention. Referring to FIG. 4, there is shown an NAND circuit 1 as the first step logic circuit comprising input terminals IN1 to IN3, PMOS transistors P1 to P3, and NMOS transistors N1 to N3, the NAND circuit 1 being supplied with VCC as a driving power source from a terminal Vcc. There is also shown an inverter circuit 2 as the second step logic circuit having an output terminal OUT, to which VPP is supplied as a driving power source from a terminal Vpp.

Between the output terminal of the NAND circuit 1 and the input terminal of the inverter circuit 2, a transfer gate N4 is connected in series, to which VCC is supplied via the gate electrode thereof.

A PMOS transistor P4 is connected between the output terminal of the transfer gate N4 and the power source terminal Vpp. The gate electrode of the PMOS transistor P4 is connected with the output terminal of an inverter circuit 3 and the input terminal of the inverter circuit 3 is connected with the output terminal of the NAND circuit 1.

This inverter circuit 3 comprises a PMOS transistor P5 and an NMOS transistor N5, the inverter circuit 3 being adapted to be supplied with VPP as a driving power source. The input terminal of the inverter circuit 3 is connected with the input terminal of the transfer gate N4.

Namely, this level conversion means is constructed to include a level conversion circuit comprising the transfer gate N4, the PMOS transistor P4 and the inverter circuit 3.

The operation of this circuit will be explained below. In the case where the NAND circuit 1 is actuated to output a potential of high level, when at least one of the input terminals IN1 to IN3 of the NAND circuit 1 becomes the low level, the high level is caused to be fed from the NAND circuit 1 via the node A to the transfer gate N4.

Since the transfer gate N4 is supplied via the gate electrode thereof with VCC, the transfer gate N4 is always kept in a conductive state during the operation thereof so that the data of high level reaching the node A is transmitted to the node B. On this occasion, the transition speed from the low level to the high level of the potential of the node B is slow due to the large conduction resistance of the transfer gate N4, and the potential of the node B starts to rise up toward the high level which is lower than VCC by the threshold voltage (VTN4) of the transfer gate N4 (VCC-VTN4).

On the other hand, the high level of the node A is reversed at the inverter circuit 3 to become the low level and supplied to the gate electrode of the PMOS transistor P4, thus causing the PMOS transistor P4 to become a conductive state. As a result, the potential of the node B which has been rising in advance toward the high level of potential (VCC-VTN4) is abruptly pulled up to the voltage VPP of the terminal Vpp.

The high level of the VPP level thus pulled up is then inverted at the inverter circuit 2 of the second stage to become a potential of the low level which is then transmitted to the output terminal OUT.

Namely, referring to FIG. 5 showing the shifting state of the transmission potential at the nodes A and B, both nodes A and B start to rise at the time t1 from the low level to the high level, and at the time t2 the node A reach the VCC level. Whereas, the node B continues to rise up to the time t3 in the same manner as in the case of the prior art at the speed which can be determined by the integral time of the conduction resistance of the transfer gate N4 and the parasitic capacity of the node B.

During the time interval from the time t3 to the time t4, the PMOS transistor P4 is turned into the conductive state due to the output inversion operation of the inverter circuit 3 as well as due to the resultant reversed low level, so that the potential at the node B is caused to rise abruptly and at the time t4 it is pulled up to the VPP level.

Therefore, it is possible according to this circuit to increase the transmission speed by the time of (t5–t4) as compared with the time (t5) required for reaching the VPP level in the conventional shifting time waveform of the node B indicated by the dot-and-dash line.

In the case where the NAND circuit 1 is actuated to output the low level, when all of the input terminals IN1 to IN3 of the NAND circuit 1 become a high level, the NAND circuit 1 is caused to shift from the high level to the low level which is then caused to be supplied via the node A to the transfer gate N4. Since the transfer gate N4 is supplied via the gate electrode thereof with VCC, the low level thus inputted is transmitted to the node B.

At this occasion, the shifting speed from the high level to the low level of the potential of the node B becomes slow due to the large conduction resistance of the transfer gate N4, and the potential of the node B starts to go down toward the low level from the high level of the VPP level.

On the other hand, the low level of the node A is inverted at the inverter circuit 3 to become a high level and supplied to the gate electrode of the PMOS transistor P4 and the PMOS transistor P4 becomes a non-conductive state. As a result, the potential of the node B which has been descending in advance toward the low level is abruptly pulled down to the ground potential.

The low level of the VPP level thus pulled down is then reversed at the inverter circuit 2 of the second stage to become a potential of the high level which is then transmitted to the output terminal OUT.

Namely, referring again to FIG. 5 showing the shifting state of the transmission potential at the nodes A and B, both nodes A and B start to descend at the time t6 from the high level to the low level, and at the time t8 the node A reaches the ground potential. Whereas, the node B continues to go down to the time t7 in the same manner as in the case of the prior art at the speed which can be determined by the integral time of the conduction resistance of the transfer gate N4 and the parasitic capacity of the node B.

During the time interval of the time t7 to t9, the PMOS transistor P4 is turned into the non-conductive state due to the output inversion operation of the inverter circuit 3 as well as due to the resultant reversed high level, so that the potential at the node B is caused to go down abruptly to the ground potential of the NAND circuit 1 through the transfer gate N4, and at the time t10 it is pulled down to the ground potential.

Therefore, it is possible according to this circuit to increase the transmission speed by the time of (t11-t10) as compared with the time (t11) required for reaching the ground potential in the conventional shifting time waveform indicated by the dot-and-dash line.

EXAMPLE 2

The second embodiment of this invention will be explained as follows. Referring to FIG. 6 depicting the second embodiment, the features which differ from the first embodiment are the interposition of a PMOS transistor P7 between the terminal Vpp and PMOS transistor P4, and the supplying of a control signal CNT to the gate electrode thereof for turning the transistor into conductive or non-conductive state. Other constructions are the same with that of the first embodiment and therefore the explanation thereof will be omitted.

This PMOS transistor P7 has a function of cutting off the through electric current I2 by giving the control signal CNT which is capable of producing the high level for a predetermined period of time.

Referring again to FIG. 5, when the NAND circuit 1 is shifted from the high level to the low level, both nodes A and B start to go down from the high level to the low level at the time t6, and the node A reaches the ground potential at the time t8. Whereas, the node B continues to go down up to the time t7 in the same manner as in the case of the prior art at the speed which can be determined by the integral time of the conduction resistance of the transfer gate N4 and the parasitic capacity of the node B. Therefore, the PMOS transistor P4 is kept in a conductive state and the output of the NAND circuit 1 is the low level and hence the NMOS transistors N1 to N3 are kept in a conductive state during the time period of the time t7 to the time t9 during which the PMOS transistor P4 is changing from the conductive state to the non-conductive state due to the output inversion operation of the inverter circuit 3 and the resultant high level derived by the inversion. Accordingly, during this time t7 to the time t9, a through electric current I2 transitionally flows from the terminal Vpp through the route of the PMOS transistor P7→the PMOS transistor P4→the transfer gate N4→the NMOS transistors N1–N3 to the ground potential.

This transitional through electric current also flows in the case of the first embodiment shown in FIG. 4 where the dashed line I1 indicates the route of the through electric current. Accordingly, if this through electric current is to be minimized through the cutoff thereof, a system should be formulated such that the control signal CNT becomes the high level at least during the period of the time t7 to t9 and the control signal CNT is supplied at the timing of the time t7.

For example, when it is to be applied to the EPROM with the terminal Vpp being set to 12V in the writing mode, at least about 10V of driving voltage (VPP-VTP7) (VTP7 means the threshold voltage of PMOS transistor P7) is supplied as the high level of the control signal to the gate electrode of the PMOS transistor P7 for a time period of the time t7 to t9.

It is possible with this construction to minimize the through electric current flowing through the NMOS transistor of the NAND circuit 1, thus reducing power consumption.

EXAMPLE 3

The third embodiment of this invention will be explained with reference to FIG. 7 showing the circuit diagram thereof. The features which differ from the second embodiment are that in the case of the second embodiment, the PMOS transistor P7 for cutting off a through electric current is interposed between the terminal Vpp and PMOS transistor P4, whereas in the case of this third embodiment, the PMOS transistor P7 for cutting off a through electric current is interposed between the PMOS transistor P4 and the node B, and at the same time the power source terminal for the inverter circuit 2 is connected to the Vpp terminal. Other constructions are the same with that of the second embodiment and therefore the explanation thereof will be omitted.

This PMOS transistor P7 is capable of cutting off the through electric current by way of a control signal CNT which is adapted to produce the high level for a predetermined period of time as in the case of the second embodiment.

The high level required in this case as a driving voltage is (VPP-VTP4-VTP7)(VTP4 means the threshold voltage of PMOS transistor P4).

Namely, during the time period of the time t7 to t9 during which the PMOS transistor P4 is changing from the conductive state to the non-conductive state due to the output inversion operation of the inverter circuit 3 and due to the resultant high level derived by the inversion, a through electric current I3 is caused to flow from the terminal Vpp through the route of the PMOS transistor P4→the PMOS transistor P7→the transfer gate N4→the NMOS transistors N1–N3 to the ground potential. As a result, it is possible with this construction of supplying the control signal CNT to minimize the through-current I3 flowing through the NMOS transistor of the NAND circuit 1, thus decreasing power consumption.

In the explanation of the aforementioned embodiments, a high voltage of VPP which is higher than VCC is supplied to the terminal Vpp. However, it is also possible to operate the circuit in another manner. For example, in the case of EPROM, the high voltage can be supplied to it only at a time of writing and the VCC can be supplied to it at a time other than writing. However, it is apparent in this case that the circuit functions not for a level conversion but for a simple signal transmitting operation. The operation of the circuit in any of these embodiments in such an occasion can be easily understood if the word VPP is substituted by the word VCC in these descriptions. Therefore, the explanation of the operation of the circuit will be omitted.

As explained above, the semiconductor device according to this invention is provided with a transfer gate for transmitting the output of the first stage logic circuit to the second stage logic circuit, and also with a level conversion means which is capable of pulling up the input terminal of the second logic circuit to a second supply potential in response to the outlet data of the first stage logic circuit in the occasion of performing a level conversion by pulling up the input terminal of the second logic circuit connected to the output terminal of the transfer gate to a second supply potential. Therefore, it is possible to avoid the delay of signal without decreasing the conduction resistance through the enlargement in size of the transistor and also to avoid any requirement to increase the circuit area, in contrast to the conventional level conversion means using as a control signal the signal from the output terminal of a transfer gate which is high in conduction resistance and large in signal delay. Moreover, since a transistor for cutting off the through electric current is inserted between the transistor for pull-up (or the pull-up transistor) and the pull up supply potential, or between the pull-up transistor and the output terminal of the second stage logic circuit, it is possible to cut off the through electric current flowing transitionally from the pull-up transistor through the transfer gate into the ground potential of the first stage logic circuit, thus decreasing power consumption.

I claim:

1. A semiconductor memory device comprising:
   a first stage logic circuit to be supplied with the first supply potential for processing a plurality of data;
   a second stage logic circuit to be supplied with the second supply potential for processing an output data derived from said first stage logic circuit and for transferring a resultant processed data to a subsequent stage;
   a transfer gate interposed between said first stage logic circuit and said second stage logic circuit, and adapted to be turned into a conductive state when said first supply potential is supplied to a gate electrode thereof for transmitting a low level of potential to said second stage logic circuit when an output data from said first stage logic circuit is a low level of a logic level, and transmitting the second high level of potential which is lower than the first high level of said logic level by a magnitude of threshold voltage to said second stage logic circuit when the output data from said first stage logic circuit is the first high level of said logic level; and
   a level conversion means being performed by pulling up an input terminal of said second stage logic circuit from said second high level to aaid second supply potential in response to said second high level;
   wherein said level conversion means is provided for pulling up said input terminal of said second stage logic circuit from said second high level to said second supply potential in response to said first high level of said output data of the first stage logic circuit in place of said second high level.

2. The semiconductor memory device of claim 1, wherein said level conversion means includes a current-cutoff means for cutting off a through electric current flowing from the second supply potential via said transfer gate to the ground potential of the first stage logic circuit for a predetermined period of time in response to a control signal of the third high level.

3. The semiconductor memory device of claim 1, wherein said level conversion means is constructed such that said transfer gate is interposed between the output terminal of said first stage logic circuit and the input terminal of said second stage logic circuit so as to be connected therebetween in series; the first p-channel MOS transistor is interposed between the input terminal of said second stage logic circuit and said second supply potential; and said output terminal of said first stage logic circuit is connected via an inverter circuit to the gate electrode of said MOS transistor.

4. The semiconductor memory device of claim 2 wherein said current-cutoff means is constructed such that the second p-channel MOS transistor adapted to be supplied through the gate electrode thereof with a control signal of said third high level is interposed between said second supply potential and a first p-channel MOS transistor in series, and at the same time the potential at the series connection point of the first and second p-channel MOS transistors is supplied as a supply potential of said second stage logic circuit. p-channel MOS transistor is interposed between the input terminal of said second stage logic circuit and said second supply potential; and said output terminal of said first stage logic circuit is connected via an inverter circuit to the gate electrode of said MOS transistor.

5. The semiconductor memory device of claim 2 wherein said current-cutoff means is constructed such that a second p-channel MOS transistor adapted to be supplied through the gate electrode thereof with said control signal of the third high level is interposed between a first p-channel MOS transistor adapted to be supplied with said second supply potential and the input terminal of said second stage logic circuit thereby forming a series connection.

6. The semiconductor device of claim 2 wherein said control signal of the third high level is transmitted during a transient period after the output terminal of said first stage logic circuit is shifted from the first high level to the low level and before the shifting of a first p-channel MOS transistor adapted to be supplied with said second supply potential from a conductive state to a non-conductive state is finished, and the voltage of said control signal of the third high level is at most the level of said second supply potential or higher than the level which is lower than said second supply potential by a magnitude of threshold voltage of a second p-channel MOS transistor.

7. The semiconductor memory device of claim 1 wherein said first supply potential is supplied in place of second supply potential.

8. The semiconductor memory device of claim 3 wherein a current-cutoff means is constructed such that the second p-channel MOS transistor adapted to be supplied through the gate electrode thereof with a control signal of said third high level is interposed between said second supply potential and a first p-channel MOS transistor in series, and at the same time the potential at the series connection point of the first and second p-channel MOS transistors is supplied as a supply potential of said second stage logic circuit.

9. The semiconductor memory device of claim 3 wherein a current-cutoff means is constructed such that a second p-channel MOS transistor adapted to be supplied through the gate electrode thereof with said control signal of the third high level is interposed between a first p-channel MOS transistor adapted to be supplied with said second supply potential and the input terminal of said second stage logic circuit thereby forming a series connection.

10. The semiconductor device of claim 4 wherein said control signal of the third high level is transmitted during a transmit period after the output terminal of said first stage logic circuit is shifted from the high level to the low level and before the shifting of a first p-channel MOS transistor adapted to be supplied with said second supply potential from a conductive state to a non-conductive state is finished, and the voltage of said control signal of the third high level is at most the level of said second supply potential or higher than the level which is lower than said second supply potential by a magnitude of threshold voltage of said second p-channel MOS transistor.

11. The semiconductor device of claim 5 wherein said control signal of the third high level is transmitted during a transmit period after the output terminal of said first stage logic circuit is shifted from the high level to the low level and before the shifting of a first p-channel MOS transistor adapted to be supplied with said second supply potential from a conductive state to a non-conductive state is finished, and the voltage of said control signal of the third high level is at most the level of said second supply potential or higher than the level which is lower than said second supply potential by a magnitude of threshold voltage of said second p-channel MOS transistor.

12. The semiconductor device of claim 8 wherein said control signal of the third high level is transmitted during a transmit period after the output terminal of said first stage logic circuit is shifted from the high level to the low level and before the shifting of a first p-channel MOS transistor adapted to be supplied with said second supply potential from a conductive state to a non-conductive state is finished, and the voltage of said control signal of the third high level is at most the level of said second supply potential or higher than the level which is lower than said second supply potential by a magnitude of threshold voltage of said second p-channel MOS transistor.

13. The semiconductor device of claim 9 wherein said control signal of the third high level is transmitted during a transmit period after the output terminal of said first stage logic circuit is shifted from the high level to the low level and before the shifting of a first p-channel MOS transistor adapted to be supplied with said second supply potential from a conductive state to a non-conductive state is finished, and the voltage of said control signal of the third high level is at most the level of said second supply potential or higher than the level which is lower than said second supply potential by a magnitude of threshold voltage of said second p-channel MOS transistor.

14. The semiconductor memory device of claim 2 wherein said first supply potential is supplied in place of second supply potential.

15. The semiconductor memory device of claim 3 wherein said first supply potential is supplied in place of second supply potential.

16. The semiconductor memory device of claim 4 wherein said first supply potential is supplied in place of second supply potential.

17. The semiconductor memory device of claim 5 wherein said first supply potential is supplied in place of second supply potential.

18. The semiconductor memory device of claim 6 wherein said first supply potential is supplied in place of second supply potential.

* * * * *

UNITED STATES PATENT AND TRADEMARK OFFICE
CERTIFICATE OF CORRECTION

PATENT NO. : 5,726,938
DATED : March 10, 1998
INVENTOR(S) : Toshiharu Okamoto

It is certified that error appears in the above-identified patent and that said Letters Patent is hereby corrected as shown below:

Claim 4, Col. 11, line 27, please delete "p-channel".

Claim 4, Col. 11, lines 28-32, please delete lines in their entirety.

Signed and Sealed this

Seventeenth Day of November, 1998

Attest:

BRUCE LEHMAN

Attesting Officer

Commissioner of Patents and Trademarks